United States Patent
Uemura et al.

(10) Patent No.: US 7,157,294 B2
(45) Date of Patent: Jan. 2, 2007

(54) GROUP III NITRIDE COMPOUND SEMICONDUCTOR LIGHT-EMITTING ELEMENT

(75) Inventors: Toshiya Uemura, Nishikasugai-gun (JP); Masaki Hashimura, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/162,255

(22) Filed: Jun. 5, 2002

(65) Prior Publication Data
US 2002/0197764 A1    Dec. 26, 2002

(30) Foreign Application Priority Data
Jun. 6, 2001    (JP)    ............... 2001-170909

(51) Int. Cl.
*H01L 33/00*    (2006.01)
(52) U.S. Cl. .............. 438/27; 257/98; 438/47
(58) Field of Classification Search ........... 438/27, 438/47; 257/98
See application file for complete search history.

(56) References Cited

U.S. PATENT DOCUMENTS

| | | | |
|---|---|---|---|
| 4,514,582 A * | 4/1985 | Tiedje et al. ............... 136/256 |
| 5,798,536 A * | 8/1998 | Tsutsui ....................... 257/999 |
| 5,998,810 A * | 12/1999 | Hatano et al. .............. 257/102 |
| 6,080,599 A * | 6/2000 | Yamamoto et al. ........... 438/33 |
| 6,091,085 A * | 7/2000 | Lester .......................... 257/98 |
| 6,133,589 A * | 10/2000 | Krames et al. ............. 257/103 |
| 6,333,522 B1 * | 12/2001 | Inoue et al. .................. 257/99 |
| 6,365,923 B1 * | 4/2002 | Kamei ........................ 257/103 |
| 6,514,782 B1 * | 2/2003 | Wierer, Jr. et al. ........... 438/22 |
| 6,809,010 B1 * | 10/2004 | Kinoshita et al. ........... 438/460 |
| 2002/0125485 A1 * | 9/2002 | Steigerwald .................. 257/79 |
| 2003/0015713 A1 * | 1/2003 | Yoo ............................. 257/79 |

FOREIGN PATENT DOCUMENTS

| JP | 56-071986 | 6/1981 |
|---|---|---|
| JP | 06-291368 | 10/1994 |
| JP | 07-162037 | 6/1995 |

OTHER PUBLICATIONS

Lee et al., "Efficiency improvement in light-emitting diodes based on geometrically deformed chips," Proceedings of SPIE, Light-Emitting Diodes: Research, Manufacturing, and Applications III, 1999, vol. 3621, pp. 237-248.*

* cited by examiner

*Primary Examiner*—Jerome Jackson
(74) *Attorney, Agent, or Firm*—McGinn IP Law Group, PLLC

(57) ABSTRACT

In a flip chip type Group III nitride compound semiconductor light-emitting element, a surface of a substrate serving as a light-emitting surface is formed as a rough surface so that radiated light is scattered by the surface.

28 Claims, 6 Drawing Sheets

GROUP III NITRIDE COMPOUND SEMICONDUCTOR LIGHT-EMITTING ELEMENT

The present application is based on Japanese Patent Application No. 2001-170909, which is incorporated herein by reference.

BACKGROUND OF THE INVENTION

1. Field of the Invention

The present invention relates to a Group III nitride compound semiconductor light-emitting element and particularly to a flip chip type Group III nitride compound semiconductor light-emitting element.

2. Description of the Related Art

Figure 6:
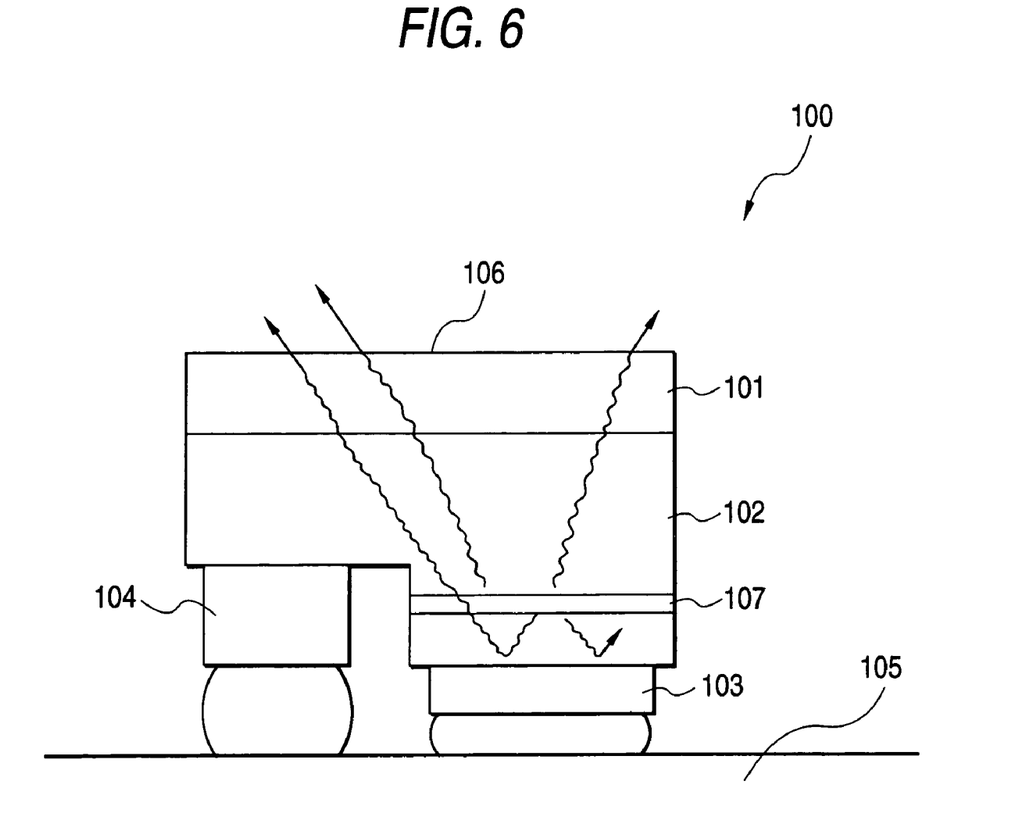
FIG. 6 is a view showing a flip chip type light-emitting element having a related-art configuration.

FIG. 6 shows a flip chip type light-emitting element 100 having a related-art configuration. The light-emitting element 100 includes a support 101, and a plurality of Group III nitride compound semiconductor layers 102 laminated on the substrate 101. The light-emitting element 100 has a surface in which electrodes 103 and 104 are formed and which serves as a mount surface. The light-emitting element 100 is mounted on a support 105 through the mount surface when light-emitting element 100 is used. In the light-emitting element 100 configured as described above, a surface 106 of the substrate 101 serves as a light-emitting surface.

In the light-emitting element 100, light emitted from a light-emitting layer-containing layer 107 is radiated out through a multilayer crystalline film constituted by a plurality of semiconductor layers. That is, light repeatedly refracted in interfaces between layers in the multilayer crystalline film is radiated out. Particularly, light emitted from the light-emitting layer-containing layer 107 toward the electrode 103 once reaches the electrode 103 and is reflected on a surface of the electrode 103 so that the reflected light travels toward the substrate 101 and passes through the multilayer crystalline film again. Accordingly, the light is repeatedly refracted by a larger number of times before radiated out. Because light repeatedly refracted in the multilayer crystalline film in such a manner is emitted from the light-emitting surface 106, the form of light radiation is largely affected by the thicknesses of the respective layers constituting the multilayer crystalline film and the states of the interfaces between the respective layers. That is, the characteristic of the light-emitting element largely depends on the thicknesses of the respective semiconductor layers and the states of interfaces between respective semiconductor layers. It is, however, difficult to control the thicknesses of the respective layers in the multilayer crystalline film strictly. Hence, there has been a problem that the characteristic varies from one light-emitting element to another light-emitting element. Moreover, variation in the characteristic of the light-emitting element directly results in variation in the characteristic of an LED lamp obtained by packaging the light-emitting element. Hence, it has been difficult to produce such an LED lamp having desired characteristic with a good yield.

Under such circumstances, an object of the invention is to reduce variation in the characteristic of a Group III nitride compound semiconductor light-emitting element.

SUMMARY OF THE INVENTION

To solve the problems, the invention is configured as follows.

A Group III nitride compound semiconductor light-emitting element including a substrate, and Group III nitride compound semiconductors laminated on the substrate, wherein the substrate has a light-scattering surface on a side from which light emission is observed.

According to such a configuration, light is scattered when radiated out because light emitted from the light-emitting layer-containing layer is radiated out through the light-scattering surface. That is, light which has passed through the light-emitting element and reached a light-emitting surface is scattered on the light-emitting surface so as to be radiated out (at random radiation angles). The form of radiation of the light is made uniform by the scattering on the light-emitting surface, so that variation in the characteristic of the light-emitting element is reduced greatly. Hence, when the light-emitting element according to the invention is used for forming an LED lamp, the LED lamp having desired characteristic can be produced with a good yield.

Features and advantages of the invention will be evident from the following detailed description of the preferred embodiments described in conjunction with the attached drawings.

DETAILED DESCRIPTION OF THE PREFERRED EMBODIMENTS

The Group III nitride compound semiconductor light-emitting element according to the invention is a flip chip type light-emitting element including a substrate, and Group III nitride compound semiconductor layers including a light-emitting layer and laminated on the substrate. The "flip chip type light-emitting element" means a light-emitting element used in a flip chip type light-emitting device, that is, it means a light-emitting element used after mounted on a support (such as a substrate) through its mount surface on which p-side and n-side electrodes are formed. In other words, a flip chip type light-emitting device can be formed by use of the light-emitting element according to the invention. In the light-emitting element according to the invention, emitted light is radiated from a substrate side, that is, from a surface opposite to the surface in which electrodes are formed.

The constituent members of the Group III nitride compound semiconductor light-emitting element according to the invention will be described below.

(Substrate)

Any substrate may be used if Group III nitride compound semiconductor layers can be grown on the substrate. Examples of the substrate material include sapphire, spinel, silicon, silicon carbide, zinc oxide, gallium phosphate, gallium arsenide, magnesium oxide, and manganese oxide. Especially, a sapphire substrate is used preferably. When a sapphire substrate is used, a surface a of the sapphire substrate is preferably used so that Group III nitride compound semiconductor layers can be grown with good crystallinity.

The substrate has a surface on which Group III nitride compound semiconductor layers are to be grown, and the opposite surface provided as a light-scattering surface. The light-scattering surface is formed as a surface for observation of light emission (hereinafter referred to as "light-emitting surface") when a light-emitting element is formed. The "light-scattering surface" means a surface through which light radiated can be at least partially scattered in an interface between the surface and a vapor phase or a sealing member such as a resin. Preferably, the light-emitting surface is formed so that light radiated through the surface can be substantially wholly scattered in order to make the form of light emission uniform all over the light-emitting surface. Incidentally, the light-emitting surface may be formed so that a part of the light-emitting surface has light-scattering characteristic. As an example of the specific configuration of the light-scattering surface, the light-emitting surface may be formed as a rough surface. Here, the "rough surface" means a surface having regular or random irregularities formed in at least one part of the surface. Preferably, a surface having such irregularities formed in the whole surface is used as the rough surface. When the light-emitting surface is selected to be a rough surface, light scatters on the irregularities formed in the surface. Here, the form of the irregularities may be designed suitably so that a desired light emission form or a desired distribution of light can be obtained. Preferably, random irregularities are formed so that a random distribution of light can be obtained. When a rough surface having such irregularities formed therein is used, random light scattering occurs in the light-emitting surface so that the characteristic of uniform distribution of light can be achieved easily. An example of the rough surface having regular irregularities formed therein is a surface in which grooves are formed at intervals of a desired pitch. When the rough surface is used, the roughness of the surface is, for example, Ra (arithmetical mean roughness) $\geq 0.01$ μm, preferably Ra$\geq 0.05$ μm. For example, the surface roughness Ra more preferably ranges from 0.01 to 10 μm, further preferably from 0.05 to 1 μm.

Figure 1:
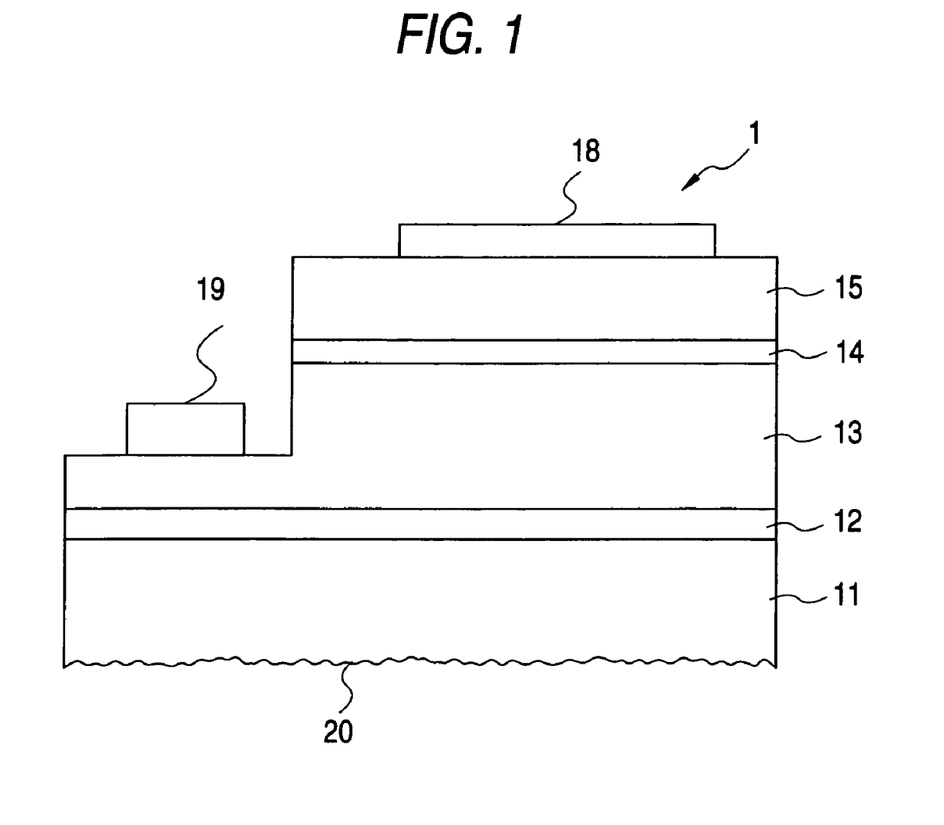
FIG. 1 is a view showing a light-emitting element as an embodiment of the invention.
Figure 2:
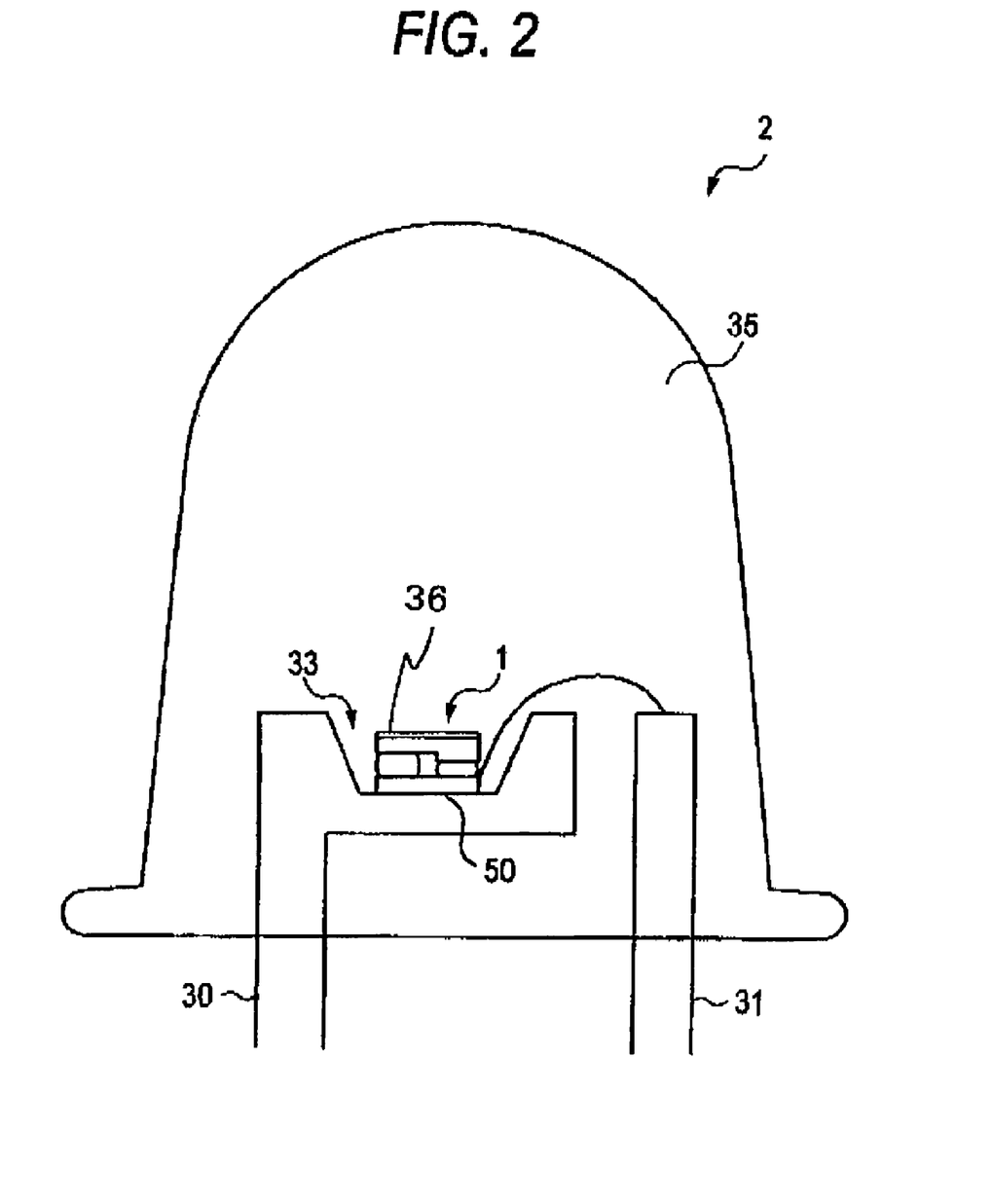
FIG. 2 is a view showing an LED formed by use of the light-emitting element.

FIG. 1 illustrates a light-emitting element 1 having a substrate 11 with a roughened light-emitting surface 20. Alternatively, as illustrated in FIG. 2, a light-scattering material 36 may be laminated on the light-emitting surface so that the light-emitting surface can be provided as a light-scattering surface.

To provide the light-emitting surface as a rough surface, for example, the light-emitting surface may be abraded with an abrasive material having a particle size sufficient to obtain a required surface roughness. Alternatively, the light-emitting surface may be subjected to etching using a pattern for forming desired irregularities in the light-emitting surface so that the light-emitting surface can be provided as a rough surface. The particle size (r) of the abrasive material is, for example, selected to be $r \geq 1$ μm, preferably $r \geq 10$ μm. For example, the more preferable particle size of the abrasive material ranges from 1 to 100 μm, especially from 10 to 50 μm. The abrading step may be carried out before, in the middle of or after the growth of Group III nitride compound semiconductor layers on the substrate. As an example, a substrate having a rear surface abraded in advance may be prepared so that a not-abraded surface of the substrate can be used as a semiconductor growth surface on which desired semiconductor layers are grown. As another example, after desired semiconductor layers are formed on the substrate, or after electrodes are formed in addition to the formation of desired semiconductor layers, the surface (light-emitting surface) of the substrate may be abraded with an abrasive material. On this occasion, reduction in thickness of the substrate may be carried out simultaneously. That is, when the thickness of the substrate is reduced by use of an abrasive material to obtain a desired surface roughness, the abraded surface of the substrate can be provided as a rough surface as well as the thickness of the substrate can be reduced.

(Group III Nitride Compound Semiconductor Layers)

Group III nitride compound semiconductor layers are laminated on the substrate. Here, the Group III nitride compound semiconductors are represented by the general formula $Al_xGa_yIn_{1-X-Y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<1$). The group III elements may be partially replaced by boron (B), thallium (Tl), etc. The nitrogen (N) maybe partially replaced by phosphorus (P), arsenic (As), antimony (Sb), bismuth (Bi), etc. Each of the Group III nitride compound semiconductor layers may contain any optional dopant. Si, Ge, Se, Te, C, etc. may be used as n-type impurities. Mg, Zn, Be, Ca, Sr, Ba, etc. may be used as p-type impurities. Incidentally, after doped with p-type impurities, the Group III nitride compound semiconductor may be subjected to electron beam irradiation, plasma irradiation or heating in a furnace. This step is not always essential. The method for forming the Group III nitride compound semiconductor layers is not particularly limited. For example, the Group III nitride compound semiconductor layers may be formed by a known method such as a metal organic chemical vapor deposition method (MOCVD method), a molecular beam epitaxy method (MBE method), a halide vapor phase epitaxy method (HVPE method), a sputtering method, an ion-plating method, or an electron shower method.

Incidentally, a homostructure, a heterostructure or a double heterostructure may be used as the structure of the light-emitting element. Further, a quantum well structure (single quantum well structure or multiple quantum well structure) may be also used as the structure of the light-emitting element.

A buffer layer may be provided between the substrate and the laminate of the crystalline layers constituted by Group III nitride compound semiconductors. The buffer layer is provided for improving the crystallinity of the Group III nitride compound semiconductors grown thereon. The buffer layer can be made of a Group III nitride compound semiconductor such as AlN, InN, GaN, AlGaN, InGaN, or AlInGaN.

(p-side Electrode)

A metal such as Rh, Au, Pt, Ag, Cu, Al, Ni, Co, Mg, Pd, Ru, Mn, Bi, Sn, or Re, or an alloy of any two kinds of metals selected from these metals may be used as a material of the p-side electrode. Especially, Rh, Pt or Ru can be used as a preferred material of the p-side electrode because it exhibits high reflecting efficiency to the wavelength of light emitted from the Group III nitride compound semiconductor light-emitting element and exhibits low contact resistance to the p-type Group III nitride compound semiconductor layer. The p-side electrode may be formed to have a double-layer or multilayer structure in which layers different in composition are laminated.

(n-side Electrode)

A metal such as Al, V, Sn, Rh, Ti, Cr, Nb, Ta, Mo, W, or Hf, or an alloy of any two kinds of metals selected from these metals may be used as a material of the n-side electrode. The n-side electrode may be formed to have a double-layer or multilayer structure in which layers different in composition are laminated. For example, the n-side electrode maybe formed to have a double-layer structure of V and Al.

For example, the Group III nitride compound semiconductor light-emitting element according to the invention can be produced as follows.

First, a substrate on which Group III nitride compound semiconductor layers can be grown is prepared. A plurality of semiconductor layers are laminated on the substrate so that at least an n-type Group III nitride compound semiconductor layer, a light-emitting layer-containing Group III nitride compound semiconductor layer, and a p-type Group III nitride compound semiconductor layer are arranged in this sequence.

Then, etching is performed so that the n-type semiconductor layer is partially revealed. Then, a p-side electrode and an n-side electrode are formed on the p-type Group III nitride compound semiconductor layer and the n-type Group III nitride compound semiconductor layer respectively. The p-side and n-side electrodes can be formed by a known method such as vapor deposition, or sputtering. Then, the substrate is abraded with an abrasive material having a desired particle size so that a desired thickness of the substrate is obtained. Then, the substrate is separated into chips.

The configuration of the invention will be described below more in detail in connection with an embodiment of the invention.

FIG. 1 is a typical view showing the configuration of a flip chip type light-emitting element 1 as an embodiment of the invention. Specifications of respective layers in the light-emitting element 1 are as follows.

| Layer | Composition |
| --- | --- |
| p-type layer 15 | p-GaN:Mg |
| Light-emitting layer-containing layer 14 | Inclusive of InGaN layer |
| n-type layer 13 | n-GaN:Si |
| Buffer layer 12 | AlN |
| Substrate 11 | Sapphire |

An n-type layer 13 made of GaN doped with Si as n-type impurities is formed on a substrate 11 through a buffer layer 12. Although this embodiment shows the case where a sapphire substrate is used as the substrate 11, the material of the substrate 11 is not limited to sapphire. Examples of the material of the substrate 11 which can be used include sapphire, spinel, silicon, silicon carbide, zinc oxide, gallium phosphate, gallium arsenide, magnesium oxide, manganese oxide, and Group III nitride compound semiconductor monocrystal. Although this embodiment also shows the case where the buffer layer 12 is made of AlN by an MOCVD method, the material of the buffer layer 12 is not limited thereto. For example, GaN, InN, AlGaN, InGaN, or AlInGaN may be used as the material of the buffer layer 12. A molecular beam epitaxy method (MBE method), a halide vapor phase epitaxy method (HVPE method), a sputtering method, an ion-plating method, an electron shower method, or the like, may be used as the method for producing the buffer layer 12. When Group III nitride compound semiconductor is used as the substrate 11, the buffer layer 12 can be omitted.

The substrate and the buffer layer may be removed in accordance with necessity after the formation of the semiconductor element.

Although this embodiment shows the case where the n-type layer is made of GaN, the invention may be applied also to the case where AlGaN, InGaN or AlInGaN is used as the material of the n-type layer.

Although this embodiment shows the case where the material of the n-type layer is doped with Si as n-type impurities, the invention may be applied also to the case where Ge, Se, Te, C, or the like, is used as n-type impurities.

The n-type layer 13 may be of a double-layer structure with an $n^-$ layer of low electron density on the light-emitting layer-containing layer 14 side and an $n^+$ layer of high electron density on the buffer layer 12 side.

The light-emitting layer-containing layer 14 may contain a light-emitting layer of a quantum well structure. The structure of the light-emitting element may be of a single hetero type, a double hetero type or a homo-junction type.

The light-emitting layer-containing layer 14 may contain a Group III nitride compound semiconductor layer provided on the p-type layer 15 side, doped with an acceptor such as magnesium and having a wide band gap. This arrangement is made for effectively preventing electrons injected into the light-emitting layer-containing layer 14 from diffusing into the p-type layer 15.

The p-type layer 15 made of GaN doped with Mg as p-type impurities is formed on the light-emitting layer-containing layer 14. Alternatively, the p-type layer may be made of AlGaN, InGaN or InAlGaN instead. Zn, Be, Ca, Sr or Ba may be used as p-type impurities instead.

Further, the p-type layer 15 may be of a double-layer structure with a $p^-$ layer of low hole density on the light-emitting layer-containing layer 14 side and a $p^+$ layer of high hole density on the electrode side.

In the light-emitting diode configured as described above, each of the Group III nitride compound semiconductor layers may be formed by an MOCVD method in a general condition or may be formed by a method such as a molecular beam epitaxy method (MBE method), a halide vapor phase epitaxy method (HVPE method), a sputtering method, an ion-plating method, or an electron shower method.

After the p-type layer 15 is formed, the p-type layer 15, the light-emitting layer-containing layer 14 and the n-type layer 13 are partially removed by etching. Thus, the n-type layer 13 is partially revealed.

Then, a p-side electrode 18 made of Rh is formed on the p-type layer 15 by vapor deposition. An n-side electrode 19 is composed of two layers of Al and V and formed on the n-type layer 13 by vapor deposition. Then, alloying is performed by a known method.

After these steps, the rear surface (light-radiating surface) of the substrate is abraded by a grinder using an abrasive material with a particle size of about 20 μm until the thickness of the substrate reaches about 100 μm. As a result, the rear surface 20 of the substrate is provided as a rough surface with Ra=about 0.1 μm. Finally, the substrate is separated into chips each having a desired size.

Next, a light-emitting device formed by use of the light-emitting element 1 will be described as an example. FIG. 2 shows a flip chip type LED 2 using the light-emitting element 1. The LED 2 generally includes the light-emitting element 1, lead frames 30 and 31, a sub-mount substrate 50, and a sealing resin 35.

Figure 3:
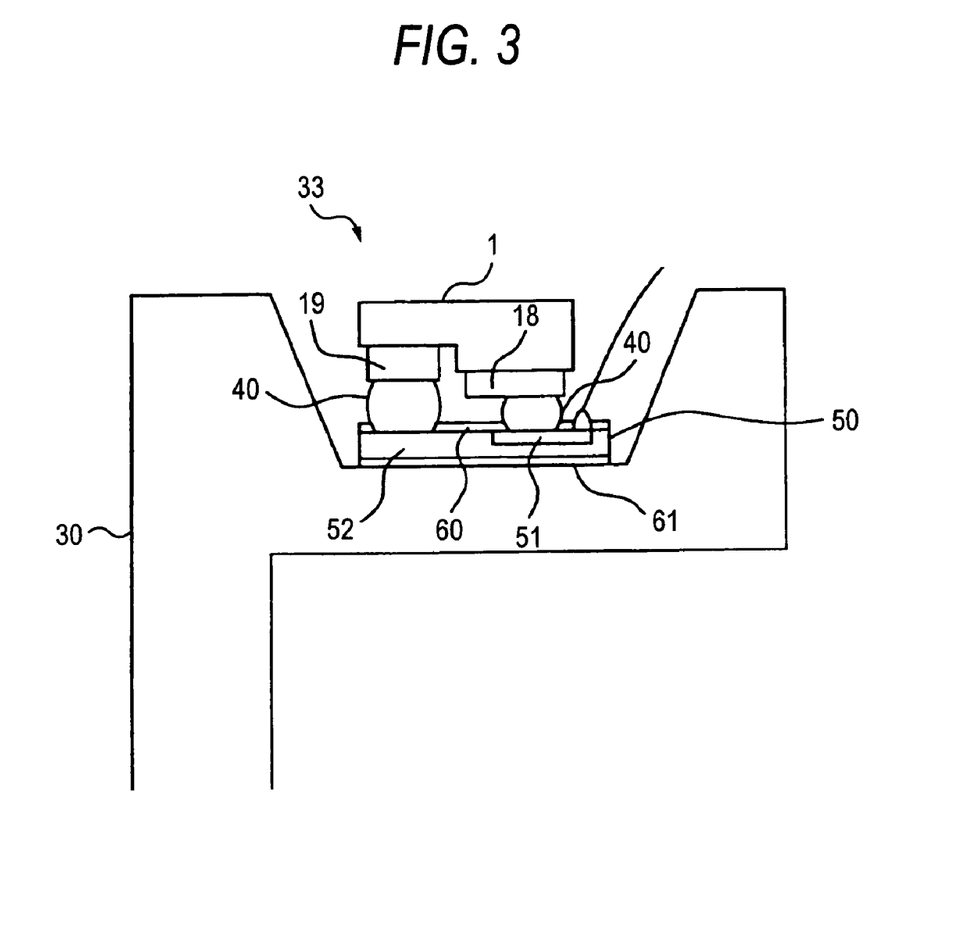
FIG. 3 is an enlarged view showing a cup-shaped portion of the LED.

FIG. 3 is an enlarged view showing a cup-shaped portion 33 of a lead frame 30. As shown in FIG. 3, the light-emitting element 1 is mounted in the cup-shaped portion 33 of the lead frame 30 through the sub-mount substrate 50. The substrate 50 has a p-type region 51, and an n-type region 52. An electrically insulating film 60 made of $SiO_2$, is formed on a surface of the substrate 50 except portions where Au bumps 40 will be formed. As shown in FIG. 3, when the light-emitting element 1 is sub-mounted on the substrate 50 in the condition that the electrode side of the light-emitting element 1 faces downward, the p-side electrode 18 is connected to the p-type region 51 of the substrate 50 through one of the Au bumps while the n-side electrode 19 is connected to the n-type region 52 of the substrate 50 through the other Au bump. In this manner, the p-side and n-side electrodes 18 and 19 in the light-emitting element 1 are electrically connected respectively to the p-type and n-type regions 51 and 52 of the substrate 50. The substrate 50 is bonded and fixed into the cup-shaped portion 33 of the lead frame 30 by silver paste 61 in a state where a surface opposite to the surface on which the light-emitting element 1 is mounted is used as the bonded surface.

Figure 4:
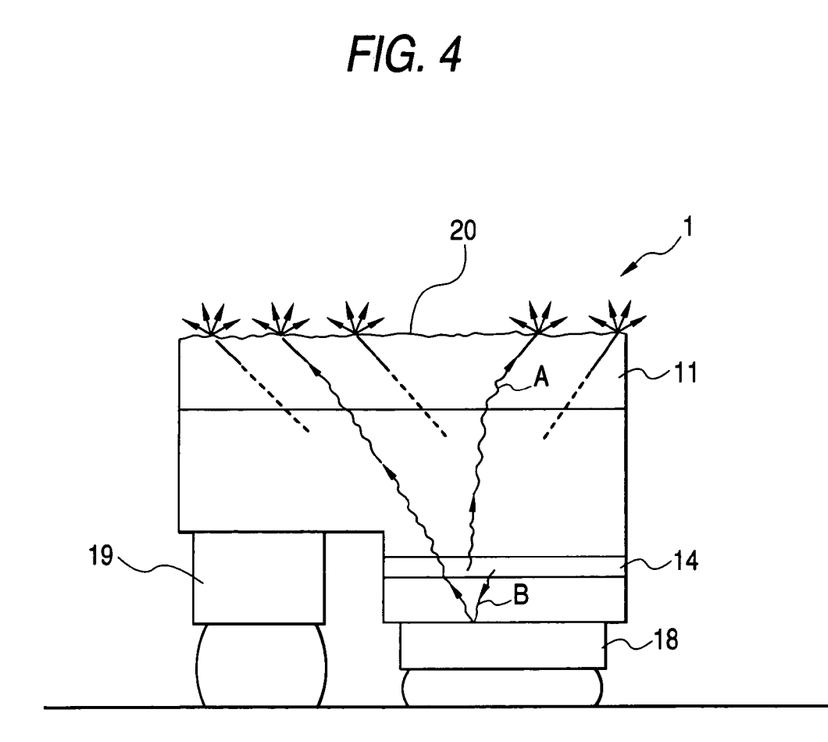
FIG. 4 is an enlarged view showing the light-emitting element in the LED.

FIG. 4 is an enlarged view showing the light-emitting element 1. Referring to FIG. 4, the form of light emission of the light-emitting element 1 will be described. As represented by the reference sign A, light emitted from the light-emitting layer-containing layer 14 toward the substrate 11 is repeatedly refracted in respective layer interfaces of the crystalline film in the course of passage through the multi-layer crystalline film such as the n-type layer 13. Finally, the light becomes incident on the rear surface 20 of the substrate 11. Because the rear surface 20 of the substrate 11 is formed as a light-scattering rough surface here, the light incident on the rear surface 20 is scattered and diffused by the rear surface 20 and radiated from the rear surface 20. On the other hand, as represented by the reference sign B, light emitted from the light-emitting layer-containing layer 14 toward the p-side electrode 18 passes through the p-type layer 15, reaches a surface of the p-side electrode 18, and is reflected by the surface. The reflected light passes through the p-type layer 15, the light-emitting layer-containing layer 14 and the n-type layer 13 again, and finally reaches the rear surface 20 of the substrate 11. This light is scattered and diffused by the rear surface 20 of the substrate 11 and radiated from the rear surface 20 in the same manner as light represented by the reference sign A because the light becomes incident on the rear surface 20 of the substrate 11 after repeatedly refracted in the course of passage through the respective semiconductor layers. In this manner, a set of light beams with random radiation angles is radiated from the rear surface 20 of the substrate 11. Although the form of light incident on the rear surface 20 of the substrate 11 varies in accordance with the thicknesses of respective layers and the interfaces between the respective layers in the multilayer crystalline film constituting the n-type layer 13, variation in the form of emission of light radiated from the rear surface 20 is suppressed because the light is scattered by the rear surface 20. Hence, the influence of variation in the growth condition of each semiconductor layer on the characteristic of light emitted from the light-emitting element is reduced greatly. As a result, light-emitting elements always having uniform characteristic can be produced.

Figure 5:
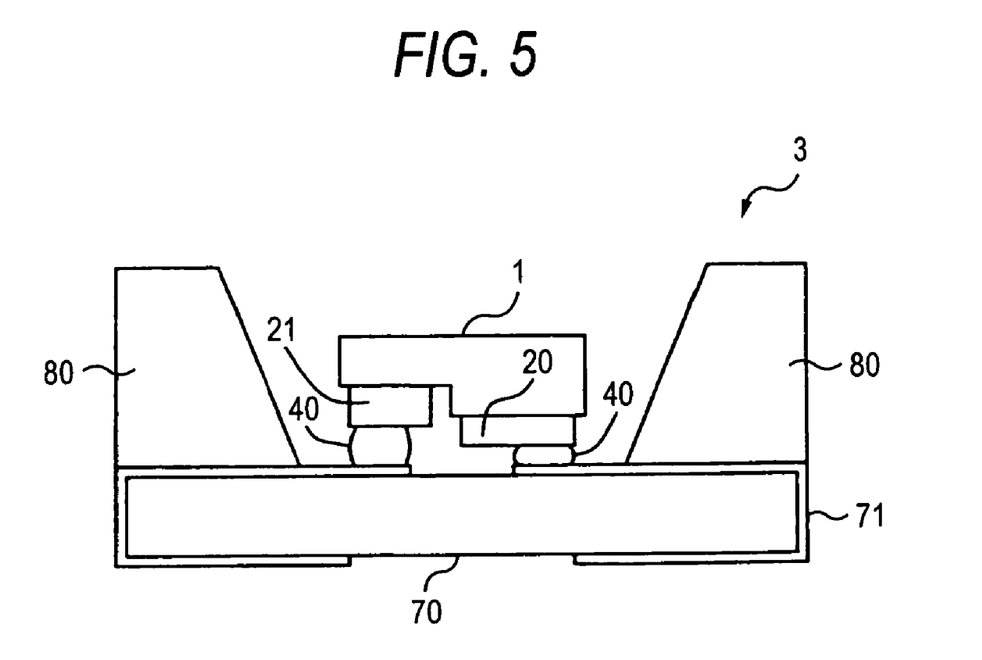
FIG. 5 is a view showing an SMD type LED formed by use of the light-emitting element.

FIG. 5 shows another type light-emitting device (LED 3) formed by use of the light-emitting element 1. The LED 3 is an SMD (Surface Mount Device) type LED. Parts the same as those of the LED 2 are referred correspondingly.

The LED 3 includes the light-emitting element 1, a substrate 70, and a reflecting member 80. The light-emitting element 1 is mounted on the substrate 70 in the condition that the electrode side of the light-emitting element 1 is used as a mount surface in the same manner as in the LED 2. A wiring pattern 71 is formed on a surface of the substrate 70. Hence, when the p-side and n-side electrodes 18 and 19 are bonded to the wiring pattern through the Au bumps 40, the two electrodes of the light-emitting element 1 are electrically connected to the wiring pattern. The reflecting member 80 is disposed on the substrate 70 so as to surround the light-emitting element 1. The reflecting member 80 is made of a white resin, so that light radiated from the light-emitting element 1 can be reflected highly efficiently on a surface of the reflecting member 80.

The invention is not limited at all to the description of the mode for carrying out the invention. The invention includes various modifications that can be conceived easily by those skilled in the art, without departing from the description of the scope of claim.

What is claimed is:

1. A method of forming a Group III nitride compound semiconductor light-emitting element said method comprising:

forming a buffer layer on a sapphire substrate;

forming a Group III nitride compound semiconductor on said buffer layer; and after said forming said Group III Nitride compound semiconductor, preparing a light-emitting surface of said substrate which is opposite said buffer layer by grinding said surface using an abrasive material having a particle size in a range of $10\ \mu m \leq r \leq 50\ \mu m$ until said substrate has a predetermined thickness and said surface has a roughness in a range of $0.05 \leq Ra \leq 1\ \mu m$ for uniformizing light emitted from said light-emitting surface.

2. A method of forming a Group III nitride compound semiconductor light-emitting element according to claim 1, wherein said preparing said surface comprises roughening said surface such that light emitted from said surface is uniformly distributed.

3. A method of forming a Group III nitride compound semiconductor light-emitting element, said method comprising:

forming a buffer layer on a sapphire substrate;

forming a Group III nitride compound semiconductor on said buffer layer;

forming at least one electrode on a same said side of said substrate as said Group III nitride compound semiconductor; and after said forming said Group III Nitride compound semiconductor, preparing a light-emitting surface on a side of said substrate which is opposite said buffer layer by grinding said surface using an abrasive material having a particle size in a range of $10\ \mu m \leq r \leq 50\ \mu m$ until said substrate has a predetermined thickness and said light-emitting surface has a roughness in a range of $0.05 \leq Ra \leq 1\ \mu m$ uniformizing light emitted from said light-emitting surface.

4. The method of forming a Group III nitride compound semiconductor light-emitting element according to claim 3, wherein said preparing said light-emitting surface comprises roughening said surface so that light emitted from said surface is uniformly distributed.

5. The method of forming a Group III nitride compound semiconductor light-emitting element according to claim 3, wherein said preparing said light-emitting surface comprises forming grooves at intervals of a desired pitch in said light-emitting surface.

6. A method of forming a Group III nitride compound semiconductor light-emitting element according to claim 3, wherein said preparing said substrate is performed before said forming said Group III nitride compound semiconductor on said substrate.

7. A method of forming a Group III nitride compound semiconductor light-emitting element according to claim 6, wherein said Group III nitride compound semiconductor is grown on a non-abraded surface of said substrate.

8. A method of forming a Group III nitride compound semiconductor light-emitting element according to claim 3, wherein said preparing said substrate is performed after said forming said at least one electrode.

9. A method of forming a Group III nitride compound semiconductor light-emitting element according to claim 1, wherein said light-emitting surface is formed on a side of said substrate which is opposite said Group III nitride compound semiconductor.

10. A method of forming a Group III nitride compound semiconductor light-emitting element according to claim 1, wherein said light-emitting surface comprises randomly distributed irregularities.

11. The Group III nitride compound semiconductor light-emitting element according to claim 3, wherein said at least one electrode comprises a positive electrode and a negative electrode.

12. The method of forming a Group III nitride compound semiconductor light-emitting element according to claim 1, wherein said predetermined thickness of said substrate comprises 100 μm.

13. The method of forming a Group III nitride compound semiconductor light-emitting element according to claim 1, wherein said roughness of said light-emitting surface causes a scattering of light which is incident on said surface to provide a uniform light emission from said light-emitting surface.

14. The method of forming a Group III nitride compound semiconductor light-emitting element according to claim 1, wherein said roughness of said surface suppresses an influence of a variation in thickness of said Group III nitride compound semiconductor on a characteristic of light emitted from said light-emitting element.

15. The method of forming a Group III nitride compound semiconductor light-emitting element according to claim 1, further comprising:
after said preparing said substrate, separating said substrate into chips,
wherein said separating said substrate into chips is performed after said preparing said substrate without performing a substrate thickness reducing step therebetween.

16. The method of forming a Group III nitride compound semiconductor light-emitting element according to claim 1, wherein said preparing said substrate simultaneously prepares said surface to have a desired roughness and reduces a thickness of said substrate to said predetermined thickness.

17. A method of forming a light-emitting device, comprising:
forming a light-emitting element comprising:
forming a buffer layer on a sapphire substrate;
forming a Group III nitride compound semiconductor on said buffer layer; and
after said forming said Group III Nitride compound semiconductor, preparing a light-emitting surface of said substrate which is opposite said buffer layer by grinding said surface using an abrasive material having a particle size in a range of $10\ \mu m \leq r \leq 50\ \mu m$ until said substrate has a predetermined thickness and said surface has a roughness in a range of $0.05 \leq Ra \leq 1\ \mu m$ for uniformizing light emitted from said light-emitting surface; and
forming a support on which said light-emitting element is mounted.

18. The method of forming a Group III nitride compound semiconductor light-emitting element according to claim 1, wherein said light-emitting surface comprises a surface a of said sapphire substrate.

19. The method of forming a Group III nitride compound semiconductor light-emitting element according to claim 1, wherein said Group III nitride compound semiconductor comprises a plurality of Group III nitride compound semiconductor layers which includes a light-emitting layer, and
wherein light from said light-emitting layer is emitted from said light-emitting surface via said plurality of Group III nitride compound semiconductor layers.

20. The method of forming a Group III nitride compound semiconductor light-emitting element according to claim 1, wherein said light-emitting element comprises a flip-chip light-emitting element, and said light-emitting surface of said sapphire substrate comprises a surface of said substrate from which light exits said flip-chip light-emitting element.

21. The method of forming a Group III nitride compound semiconductor light-emitting element according to claim 20, wherein said light-emitting surface comprises a surface of said substrate at an interface between said substrate and a sealing resin formed on said flip-chip light-emitting element.

22. The method of forming a Group III nitride compound semiconductor light-emitting element according to claim 1, wherein said buffer layer improves a crystallinity of said Group III nitride compound semiconductor formed on said buffer layer.

23. The method of forming a Group III nitride compound semiconductor light-emitting element according to claim 1, wherein said forming said Group III nitride compound semiconductor comprises using metal organic chemical vapor deposition (MOCVD).

24. The method of forming a Group III nitride compound semiconductor light-emitting element according to claim 1, wherein said buffer layer comprises a Group III nitride compound semiconductor.

25. The method of forming a Group III nitride compound semiconductor light-emitting element according to claim 1, wherein said buffer layer comprises one of AlN, InN, GaN, AlGaN, InGaN, and AlInGaN.

26. The method of forming a Group III nitride compound semiconductor light-emitting element according to claim 1, wherein said forming said buffer layer comprises using one of molecular beam epitaxy (MBE), halide vapor phase epitaxy (HVPE), sputtering, ion-plating, and an electron shower.

27. A method of forming a Group III nitride compound semiconductor light-emitting element according to claim 1, wherein said preparing said surface is performed after said forming said buffer layer.

28. The method of forming a Group III nitride compound semiconductor light-emitting element according to claim 1, wherein said roughness of said surface suppresses an influence of a variation in thickness of said buffer layer on a characteristic of light emitted from said light-emitting element.

* * * * *